US008206552B2

(12) United States Patent
Chen et al.

(10) Patent No.: US 8,206,552 B2
(45) Date of Patent: Jun. 26, 2012

(54) RF POWER DELIVERY SYSTEM IN A SEMICONDUCTOR APPARATUS

(75) Inventors: Zhigang Chen, San Jose, CA (US); Shahid Rauf, Pleasanton, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1036 days.

(21) Appl. No.: 12/146,189

(22) Filed: Jun. 25, 2008

(65) Prior Publication Data
US 2009/0321019 A1 Dec. 31, 2009

(51) Int. Cl.
*C23F 1/00* (2006.01)
*H01L 21/306* (2006.01)
*C23C 16/00* (2006.01)

(52) U.S. Cl. .......... 156/345.44; 156/345.51; 118/723 E; 118/728

(58) Field of Classification Search ............. 156/345.43, 156/345.44, 345.45, 345.46, 345.47; 118/715, 118/722, 723 R, 723 E
See application file for complete search history.

(56) References Cited

U.S. PATENT DOCUMENTS

| 5,478,429 | A * | 12/1995 | Komino et al. .......... 156/345.44 |
| 2004/0027781 | A1 * | 2/2004 | Hanawa et al. .............. 361/234 |
| 2005/0056370 | A1 | 3/2005 | Brown et al. |
| 2005/0133166 | A1 | 6/2005 | Satitpunwaycha et al. |
| 2005/0274324 | A1 * | 12/2005 | Takahashi et al. ........ 118/723 E |
| 2006/0051966 | A1 | 3/2006 | Or et al. |
| 2006/0191879 | A1 * | 8/2006 | Tomita et al. ............ 219/121.47 |
| 2007/0047170 | A1 | 3/2007 | Sun et al. |
| 2007/0141729 | A1 | 6/2007 | Dhindsa et al. |
| 2007/0165356 | A1 | 7/2007 | Nguyen et al. |
| 2007/0256786 | A1 | 11/2007 | Zhou et al. |

FOREIGN PATENT DOCUMENTS

| WO | WO-00-21127 A1 | 4/2000 |
| WO | WO-00/59018 A1 | 10/2000 |

OTHER PUBLICATIONS

PCT international search report and written opinion of PCT/US2009/046842 dated Jan. 15, 2010.

* cited by examiner

*Primary Examiner* — Maureen Gramaglia
(74) *Attorney, Agent, or Firm* — Patterson & Sheridan, LLP

(57) ABSTRACT

Embodiments of the invention provide an apparatus which provide good RF uniformity within a processing chamber. In one embodiment, an apparatus includes a substrate support assembly, a terminal, and a dielectric insulator. The substrate support assembly has a center passage formed along a center axis. An RF transmission line is provided. The RF transmission line has a substantially vertical portion and a substantially horizontal portion, wherein the terminal is coupled to the substantially horizontal portion of the RF transmission line. The dielectric insulator circumscribes the substantially horizontal portion of the RF transmission line. The dielectric insulator has a first opening through which the terminal passes.

15 Claims, 5 Drawing Sheets

RF POWER DELIVERY SYSTEM IN A SEMICONDUCTOR APPARATUS

BACKGROUND

1. Field

Embodiments of the invention generally relate to an RF delivery system in a semiconductor substrate processing apparatus and the like.

2. Description of the Related Art

The demand for faster, more powerful integrated circuits (IC) devices has introduced new challenges for IC fabrication technology, including the need to etch submicron features on a substrate, such as a semiconductor wafer, with a good uniformity across the substrate. For example, deep trench storage structures used in some dynamic random access memory applications require deep high aspect ratio trenches to be etched into a semiconductor substrate. Deep silicone trench etching is typically carried out in a reactive ion etching (RIE) process.

FIG. 1 depicts a conventional processing chamber 100 utilized for etching material layers disposed on a substrate 144 to form features therein. The processing chamber 100 has a substrate support assembly 148 disposed in an interior volume 106 of the processing chamber 100. The substrate support assembly 148 includes an electrostatic chuck 166, a base plate 164 and a facility plate 190. The base plate 164 and the facility plate 190 are electrically insulated by an insulating material 192 disposed therebetween. Alternatively, a gap or a space may be defined between the base plate 164 and the facility plate 190 to provide electrical insulation. A dielectric insulator ring 120 may be attached to an edge of the facility plate 190. The electrostatic chuck 166 and the base plate 164 are generally formed from ceramic or similar dielectric materials. A heating element 176 is disposed in the electrostatic chuck 166 or the base plate 164 and is utilized to control the temperature of a substrate disposed on the substrate support assembly 148. The heating element 176 is coupled by wires disposed in a center region of the substrate support assembly 148 to a heater power source 178.

At least one clamping electrode 180 is disposed in the electrostatic chuck 166 or the base plate 164. The clamping electrode 180 is coupled to a chucking RF power source 164 through the center portion of the substrate support assembly 148. An RF electrode 182 disposed in one of the electrostatic chuck 166 or base plate 164 is coupled to one or more RF power sources 184, 186 through a matching circuit 188 through an RF transmission line 150 to maintain a plasma in the processing chamber 100. The RF transmission line 150 is disposed through the substrate support assembly 148 in a location that is offset from a center axis of the substrate support assembly 148. The RF transmission line 150 is utilized to transmit RF power supplied from the RF power sources 184, 186 to the RF electrode 182. Since some substrate support utilities occupy the space along the central axis of the substrate support assembly 148, the RF transmission line 150 is coupled to a metal plate 154 disposed in the substrate support assembly 148. The metal plate 154 is utilized to conduct the RF power from the offset RF transmission line 150 to a central feed through 152 routed through the center of the substrate support assembly 148.

Typically, it is desired to apply RF power to the substrate surface in a manner that produces a uniform electric field across the substrate surface to promote plasma uniformity. Uniform distribution of the electric field and dissociated ion plasma across the substrate surface provides uniform etching behavior across the substrate surface. In order to maintain uniform electric field and plasma distribution, it is desired that the RF power is supplied to the substrate through a center region of the processing chamber, e.g., either through a showerhead electrode and/or through a substrate support electrode. As discussed above, the center portion of the substrate support assembly 148 is occupied by utilities and/or routing a shaft utilized to actuate lift pins (not shown). The RF transmission line 150 needs to be offset from the center of the substrate support assembly 148. Accordingly, in conventional configurations, the RF transmission line 150 is typically coupled to the base plate 164 at a position offset to the center axis of the substrate support assembly 148. The metal plate 154 is therefore utilized to carry the RF power from the offset RF transmission line 150 to the center region of the substrate support assembly 148 through the center conduit 152 disposed therein.

As the top portion 156 of the RF transmission line 150 is directly below the facility plate 190 at a region 158 offset to the center axis of the substrate support assembly 148, the electric field generated around the region 158 is particularly different from other regions outward from the contacted region 158. For example, in the region 158 directly above the RF transmission line 150, the electric field is typically weaker than the electric field spread out in other regions where the RF transmission line 150 is adjacent but not directly below. The offset the RF transmission line 150 often results in non-uniform electric field, thereby creating a skew pattern of the electric filed across the substrate surface.

FIG. 2 depicts an electric field distribution measured across the surface of the substrate 144 positioned on the substrate support assembly 148 while applying an RF power thereto. The electric field in the region 158 where the RF transmission line 150 is positioned is comparatively weaker than the electric fields in other regions 160 across the substrate, resulting in the undesired skew of the electric field. Skew of the electric field contributes to non-uniform ion dissociation and plasma distribution across the substrate surface, thereby causing in poor etching uniformity.

Therefore, there is a need for an improved apparatus for providing uniform electric field distribution across a substrate surface.

SUMMARY

Embodiments of the invention provide an apparatus, such as a substrate support assembly, suitable for use in an etch reactor. It is contemplated that the apparatus may also be utilized in other types of reactors, such as those for deposition, annealing, implanting, and other processes where uniform electric fields about a substrate support are desired.

Embodiments of the invention provide an apparatus which provides good RF uniformity within a processing chamber. In one embodiment, an apparatus includes a substrate support assembly, a terminal, and a dielectric insulator. The substrate support assembly has a center passage formed along a center axis. An RF transmission line comprising s a substantially vertical portion and a substantially horizontal portion is provided. The terminal is coupled to the substantially horizontal portion of the RF transmission line. The dielectric insulator circumscribes the substantially horizontal portion of the RF transmission line. The dielectric insulator has a first opening through which the terminal passes to engage the substantially horizontal portion of the RF transmission line.

In another embodiment, a substrate support assembly is provided that includes an electrostatic chuck, a conductive base, and a conductive facility plate. A center passage is defined through the electrostatic chuck, the conductive base and the conductive facility plate. A terminal is coupled to the facility plate and to an RF transmission line. A dielectric insulator circumscribes at least a portion of the RF transmission line. The dielectric insulator has a first opening through which the terminal passes to engage the RF transmission line and a second opening concentrically aligned with the first opening. A housing assembly secures the dielectric insulator to the facility plate. A high voltage power feed extends through a hole of the housing assembly, first and second openings of the dielectric insulator and the terminal to the chucking electrode, the high voltage power feed is insulated from the RF transmission line.

In yet another embodiment, an apparatus includes a substrate support assembly, an RF transmission line coupled to a bottom of the substrate support assembly at a region offset to a center axis of the substrate support assembly, a metal plate coupled to the RF transmission line configured to divert RF power transmitted from the RF transmission line to the substrate support assembly, wherein the metal plate comprises a plurality of conduits disposed on a base.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
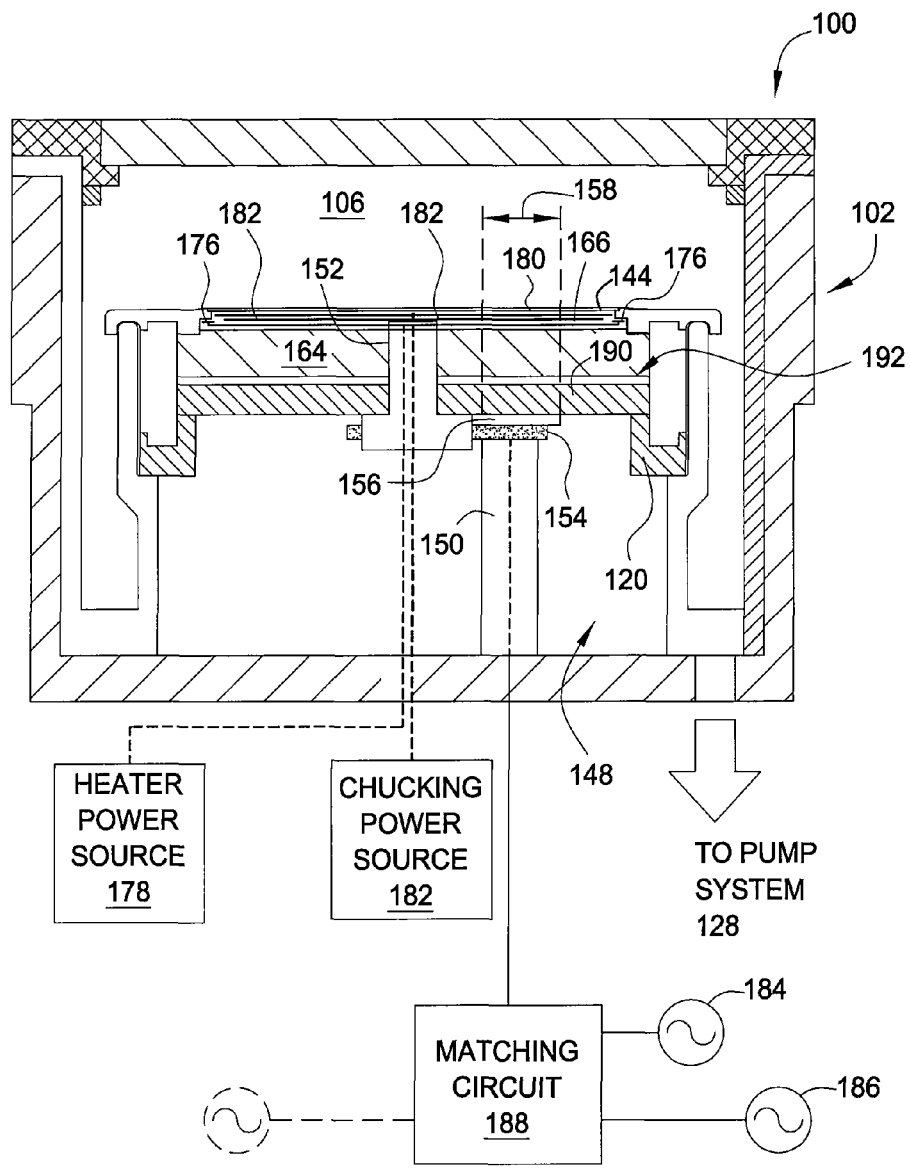
FIG. 1 depicts a sectional view of a conventional processing chamber.
Figure 2:
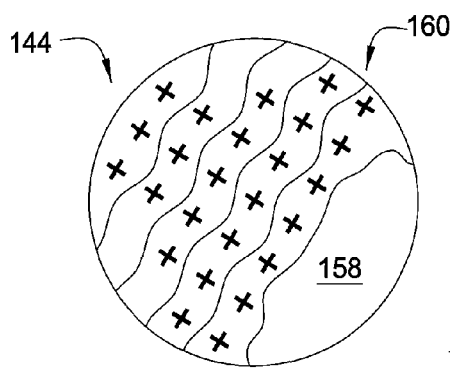
FIG. 2 depicts a electric field profile across a substrate surface disposed in the conventional processing chamber of FIG. 1.
Figure 3:
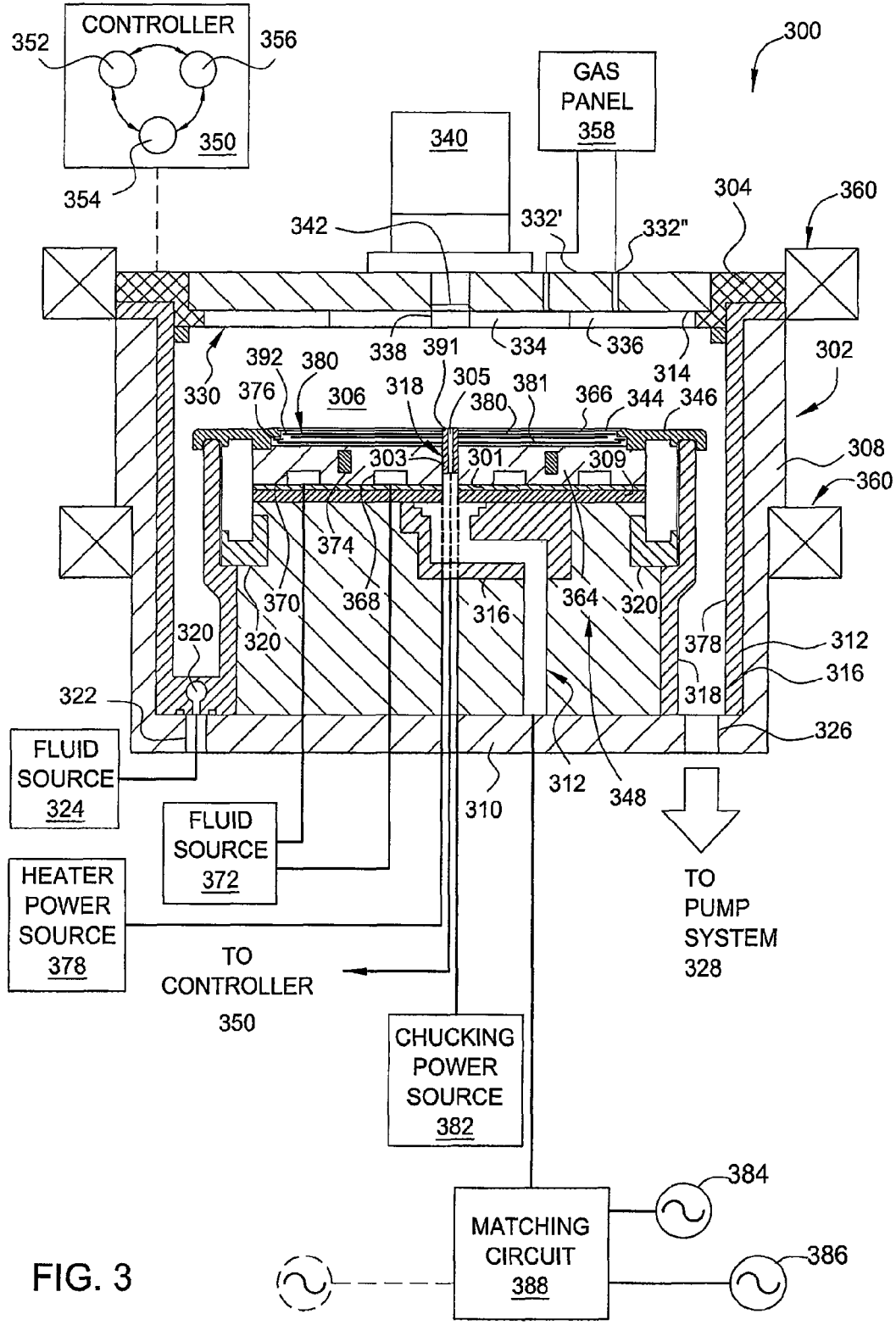
FIG. 3 depicts a sectional view of one embodiment of a processing chamber in accordance with the present invention.

FIG. 3 depicts a sectional view of one embodiment of processing chamber 300 that can provide uniform electric field across a substrate surface, providing a high etching uniformity across a substrate surface. Although the processing chamber 300 is shown including a plurality of features that enable superior etching performance, it is contemplated that other processing chambers may be adapted to benefit from one or more of the inventive features disclosed herein, including those used for non-etching semiconductor processing applications.

The processing chamber 300 includes a chamber body 302 and a lid 304 which enclose an interior volume 306. The chamber body 302 is typically fabricated from aluminum, stainless steel or other suitable material. The chamber body 302 generally includes sidewalls 308 and a bottom 310. A substrate access port (not shown) is generally defined in a side wall 308 and selectively sealed by a slit valve to facilitate entry and egress of the substrate 344 from the processing chamber 300. An exhaust port 326 is defined in the chamber body 302 and couples the interior volume 306 to a pump system 328. The pump system 328 generally includes one or more pumps and throttle valves utilized to evacuate and regulate the pressure of the interior volume 306 of the processing chamber 300. In one embodiment, the pump system 328 maintains the pressure inside the interior volume 306 at operating pressures typically between about 10 mTorr to about 20 Torr.

The lid 304 is sealingly supported on the sidewall 308 of the chamber body 302. The lid 304 may be opened to allow excess to the interior volume 306 of the processing chamber 300. The lid 304 includes a window 342 that facilitates optical process monitoring. In one embodiment, the window 342 is comprised of quartz or other suitable material that is transmissive to a signal utilized by an optical monitoring system 340. The optical monitoring system 340 is positioned to view the substrate 344 positioned on a substrate support assembly 348 through the window 342. One optical monitoring system that may be adapted to benefit from the invention is the EyeD® full-spectrum, interferometric metrology module, available from Applied Materials, Inc., of Santa Clara, Calif. Details of how to use examples of an optical monitoring have been disclosed in commonly assigned U.S. Application Ser. No. 60/479,601, titled "Method and System for Monitoring an Etch Process", filed on Jun. 18, 2003, U.S. Pat. No. 6,413, 837, titled "Film Thickness Control Using Spectral Interferometry", issued on Jul. 2, 2002, and U.S. Application Ser. No. 60/462,493, titled "Process Control Enhancement and Fault Detection Using In-Situ and Ex-situ Metrologies and Data Retrieval In Multiple Pass Wafer Processing", filed on Apr. 11, 2003, all of which are incorporated by reference in their entireties.

A gas panel 358 is coupled to the processing chamber 300 to provide process and/or cleaning gases to the interior volume 306. In the embodiment depicted in FIG. 3, inlet ports 332', 332" are provided in the lid 304 to allow gases to be delivered from the gas panel 358 to the interior volume 306 of the processing chamber 300.

A showerhead assembly 330 is coupled to an interior surface 314 of the lid 304. The showerhead assembly 330 includes a plurality of apertures and a central passage 338 that allow the gases flowing through the showerhead assembly 330 from the inlet port 332 into the interior volume 306 of the processing chamber 300 in a predefined distribution across the surface of the substrate 344 being processed in the chamber 300. In one embodiment, the showerhead assembly 330 is configured with a plurality of zones that allow for separate control of gas flowing into the interior volume 306 of the processing chamber 300. In the embodiment depicted in FIG. 3, the showerhead assembly 330 as an inner zone 334 and an outer zone 336 that are separately coupled to the gas panel 358 through separate inlets 332.

A substrate support assembly 348 is disposed in the interior volume 306 of the processing chamber 300 below the showerhead assembly 330. The substrate support assembly 348 holds the substrate 344 during processing. The substrate support assembly 348 generally includes a plurality of lift pins (not shown) disposed therethrough that are configured to lift the substrate from the support assembly 348 and facilitate exchange of the substrate 344 with a robot (not shown) in a conventional manner.

In one embodiment, the substrate support assembly 348 includes an electrostatic chuck 366 attached to a base plate 364. The electrostatic chuck 366 is disposed on the base plate 364 and is circumscribed by a focus ring 346. A facility plate 309 is attached to the base plate 364. The base plate 364 and the facility plate 309 is electrically insulated by an insulating material 301. Alternatively, the base plate 364 and the facility plate 309 may be electrically insulated by a space or a gap formed therebetween. A dielectric insulating ring 320 is coupled to a bottom surface of the facility plate 309. Routing utilities, such as fluids, power lines and sensor leads, among other, are coupled through the dielectric insulator ring 320 to the base plate 364 and electrostatic chuck 366.

At least one of the base plate 364 or electrostatic chuck 366 may include at least one optional embedded heater 376, at least one optional embedded isolator 374 and a plurality of conduits, 368, 370 to control the lateral temperature profile of the support assembly 348. The conduits 368, 370 are fluidly coupled to a fluid source 372 that circulates a temperature regulating fluid therethrough. The heater 376 is regulated by a power source 378. The conduits 368, 370 and heater 376 are utilized to control the temperature of the base plate 364, and heat and/or cool the electrostatic chuck 366. IN one embodiment, the conduits and the heater control, at least in part, the temperature of the substrate 344 disposed on the electrostatic chuck 366. The temperature of the electrostatic chuck 366 and the base plate 364 is monitored using a plurality of sensors 392 controlled by a controller 350 to detect temperature in different regions of the electrostatic chuck 366 and the base plate 364.

The electrostatic chuck 366 is generally formed from ceramic or similar dielectric material and comprises at least one clamping electrode 380 controlled using a chucking power source 382. An RF electrode 381 is coupled to one or more RF power sources 384, 386 through a conductive feed through 383 through a matching circuit 388 for maintaining a plasma formed form process and/or other gases within the processing chamber 300. The facility plate 301 is coupled to the RF power sources 384, 386 through an RF transmission system 312 to energize the RF electrode 381 through a passage 318 formed in a center portion of the substrate support assembly 348. The facility plate 309 is fabricated from a conductive material that may electrically and conductively carry RF power from the RF power sources 384, 386 through the center passage 318 to the RF electrode 381 disposed in the electrostatic chuck 366. In the embodiment, the RF power sources 384, 386 are generally capable of producing an RF signal having a frequency from about 50 kHz to about 3 GHz and a power of up to about 10,000 Watts. The matching network 488 matches the impedance of the sources 384, 386 to the plasma impedance.

The passage 318 includes a high voltage (HV) cable 305 coaxially disposed in a conduit 303. The passage 318 facilitates transmission of chucking power and RF power individually at cable 305 and the conduit 303 formed in the passage. The passage 318 facilitates transmission of the chucking power supplied from the chucking power source 382 to the chucking electrode 380 and transmission of RF power supplied from RF power sources 384, 386 to the RF electrode 381. An RF transmission system 312 is disposed in the dielectric insulator ring 320 attaching to the facility plate 309. The HV cable 305 in the passage 318 is extended and passing through a portion of the transmission system 312 to the chucking power source 382. A housing assembly 316 is coupled to the bottom of the facility plate 309, circumscribing a bent portion of the RF transmission system 312. Details of the passage 318, the RF transmission system 312 and the housing 316 will be further described with referenced to FIGS. 4A-D.

Figures 4A, 4D:
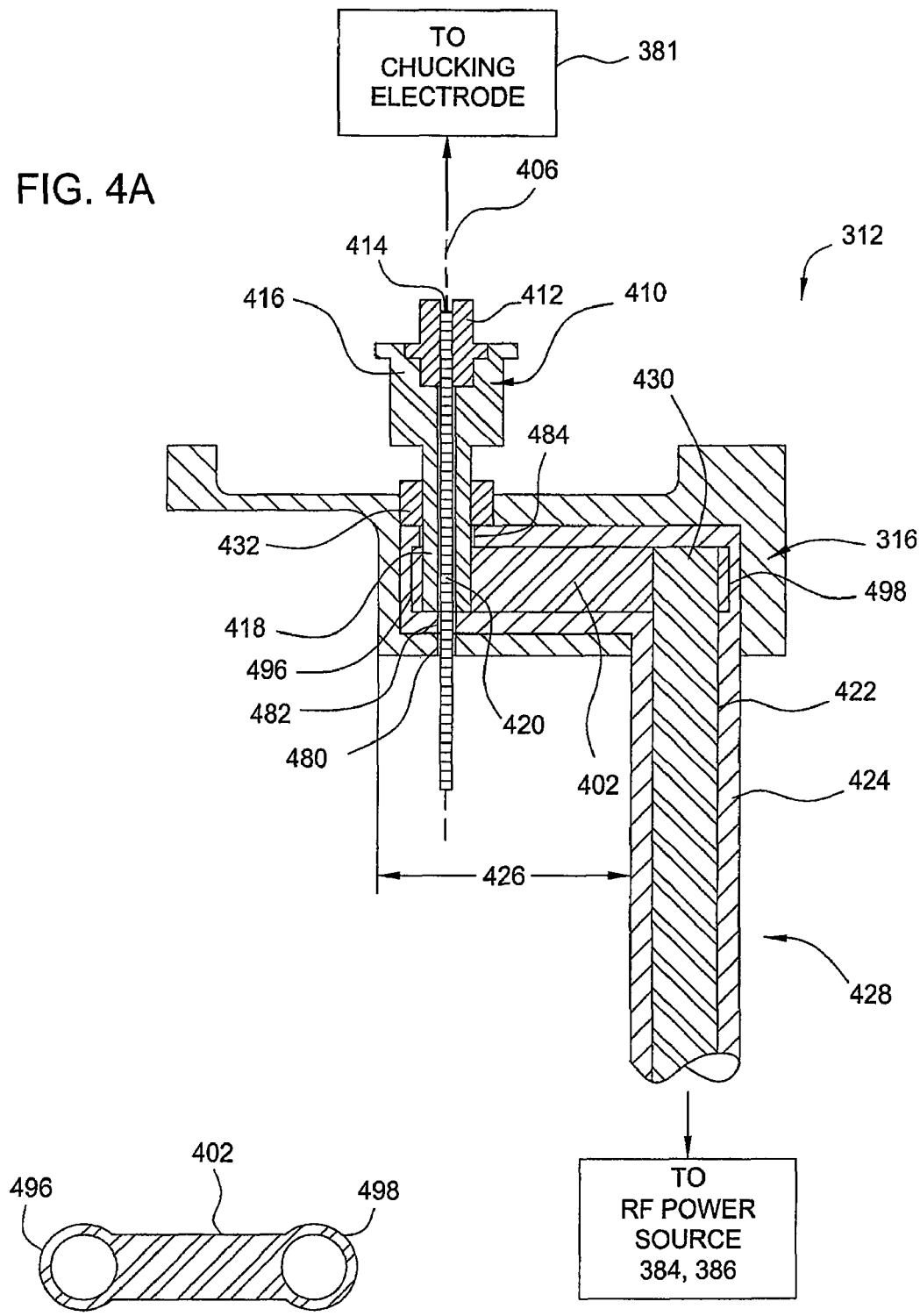
FIG. 4A depicts a sectional view of a substrate support assembly in accordance with the present invention.
FIG. 4D depicts a cross sectional view of a horizontal passage of the RF transmission line of FIG. 4A.

FIG. 4A depicts a cross sectional view of an exemplary RF transmission system 312 coupled to the passage 318 formed in the substrate support assembly 348. The RF transmission system 312 has a center axis 406 coupled substantially to align with a center axis of the substrate support assembly 348. The RF transmission system 312 includes a bent RF transmission line 428, a terminal 410 and the housing assembly 316 circumscribing a portion of the RF transmission line 428. The terminal 410 has a central aperture that allows passage of power feed 420. The power feed 420 having a top end 414 formed and exposed to connect to a bottom end of the HV cable 305 disposed in the passage 318 formed in the center of the substrate support assembly 348. The power feed 420 facilitates transmission of the chucking power from the chucking power source 382, as shown in FIG. 3, through the HV cable 305 to the clamping electrode 380 disposed in the electrostatic chuck 366. An insulator 412 may be utilized between the power feed 420 and the terminal 410 to provide a good sealing and electrical insulation. In one embodiment, the insulator 412 may be fabricated from a dielectric material, such as plastic, polymer or fluorocarbon, such as TEFLON, that can provide good sealing as well as electrical insulation.

In one embodiment, the terminal 410 has a substantially longitudinal body having a lower portion 418 disposed in the bent RF transmission line 428 and an upper portion 416 extending upward and protruded out of the bent RF transmission line 428. The lower portion 418 of the terminal 410 is electrically isolated from the power feed 420 disposed therein, for example, by an insulator sleeve (not shown). The bent RF transmission line 428 has an first aperture 496 formed and sized to receive the lower portion 418 of the RF terminal 410 and facilitates conductance of RF power from RF power sources through the terminal 410 to the RF electrode 381. In one embodiment, the terminal 410 may be fabricated from conductive materials, such as copper, aluminum, stainless steel and combinations thereof.

Figure 4B:
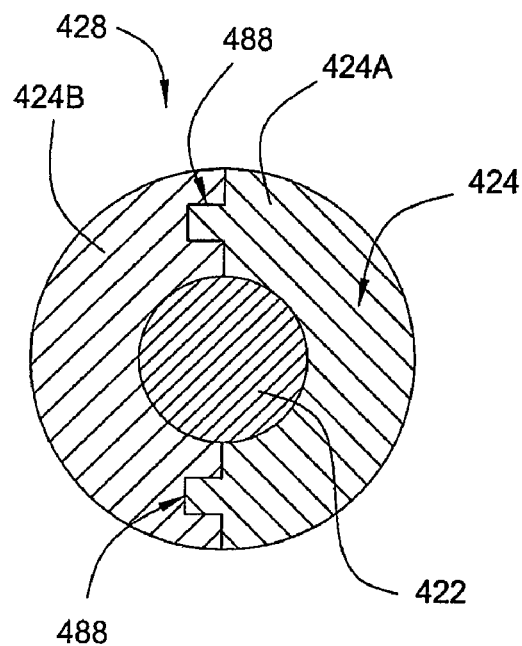
FIG. 4B depicts a cross sectional view of an RF transmission line coupled to the substrate support assembly of FIG. 4A.

In one embodiment, the bent RF transmission line 428 includes a connector 402 and an RF rod 422 that are circumscribed by a dielectric insulator 424. Referring first to FIG. 4B, the RF transmission line 428 includes the dielectric insulator 424. The insulator 424 is comprised of mating shells that circumscribe the RF rod 422 and connector 402. The dielectric insulator 424 may be fabricated from a dielectric material, such as plastic, polymer or TEFLON, which may provide good sealing as well as electrical insulation.

The dielectric insulator 424 includes an aperture 482 which is aligned with an aperture 484. The apertures 482, 484 are aligned concentrically with the center axis 406. The aperture 484 allows the terminal 410 to extend through the insulator 424 and mate with the connector 402. The aperture 482 allows the power feed 420 to extend up through the bottom of the insulator 424 and extend concentrically through the terminal 410. The shells 424A, 424B generally include a mating feature 488 which prevents line of sight seen between the shells 424A, 424B.

In the embodiment depicted in FIG. 4B, the mating feature 488 is in the form of a tongue and groove joint. The mating feature 488 may include a press or snap-fit which secures the shells 424A, 424B together.

The RF rod 422 is fabricated from a material having high conductivity to facilitate transmission of the RF power from RF power source 384, 386. In one embodiment, the RF rod 422 may be fabricated from a metal material selected from a group consisting of copper, silver, gold, and other suitable metallic materials. The bent RF transmission line 428 has a substantially L-shape defined by the connector 402 disposed in a substantially horizontal orientation which is coupled to the substantially vertical rod 422.

Referring now to FIG. 4D, connector 402 of the RF transmission line 428 has the first aperture 496 configured to receive the lower portion 418 of the terminal 410 and a second aperture 498 configured to receive the upper end of the rod 422 of the RF transmission line 428. Detail descriptions of the RF transmission line 428 and the RF terminal will be further discussed below with referenced to FIG. 4C.

Referring back to FIG. 4A, as the space substantially around the center axis 406 of the substrate support assembly 348 may be utilized for routing utilities, sensor leads and the like, or mechanical support disposed therein, that prevents the positioning of the RF transmission line 428 directly underneath, the L-shape and bent configuration of the RF transmission line 428 can efficiently provide space for routing these utilities while efficiently delivering RF power through the center of the substrate support assembly 348. The length 426 of the connector 402 is sufficient to position the rod 422 offset and clear from the utilities or other mechanical support centrally disposed underneath the substrate support assembly 348. In the embodiment wherein the routing utilities or mechanical support disposed underneath the center portion of the substrate support assembly 348 have a relatively smaller size, the length 426 of the connector 402 may be shorter so as to minimize the lateral offset of the RF power in the RF transmission line 428. In one embodiment, the length 426 of the connector 402 is between about 1 inch and about 10 inch, such as between about 1 inch and about 5 inch, for example, between about 1 inch and about 2 inch.

The housing assembly 316 is disposed below and in contact with the dielectric insulating ring 320 having a center opening to receive the lower portion 418 of the RF terminal 410. The housing assembly 316 circumscribes the connector 402 and an upper portion 430 of the rod 422 of the RF transmission line 428. In one embodiment, the housing assembly 316 may be fabricated from a material that can shield RF power from interaction with the plasma, ions, or dissociated species during process which may cause electric field distribution non-uniformity. As the housing assembly 316 can shield RF power, the RF power transmitted through the connector 402 can be efficiently be shield from interaction with the plasma generated in the processing chamber 300. In one embodiment, the housing assembly 316 is fabricated from hard and non-magnetic stainless steel. The housing assembly 316 has a hole 480 that aligns with the hole 482 of the insulator 424 to allow passage of the power feed 420 along the axis 406. The housing assembly 316 secures the upper end of the transmission line 428 to the support assembly 348. The housing assembly 316 additionally circumscribes the upper portion of the insulator 424 which covers the connector 402. Thus, the housing assists in securing the shells 424A, 424B together.

Thus, the insulator 424 and housing assembly 316 substantially prevents the RF transmission line 428 from direct contact to the substrate support assembly 348 to avoid localized electric field non-uniformity. The horizontal portion of the insulator 424 circumscribing the connector 402 insulator 424 serves as an electric shield that prevents the electronic magnetic power from the transmission line 428 from interfering with the electronic field distribution across the substrate surface during RF power transmission.

In one embodiment, an insulator 432 is disposed between the lower portion 318 of the RF terminal 410 and the housing assembly 428 above the bent RF transmission line 428. The insulator 432 assists filling the gap or interval that may exist among the dielectric insulating ring 320, the housing assembly 316 and the RF transmission line 428 and provides a good sealing to adjacent chamber components.

Figure 4C:
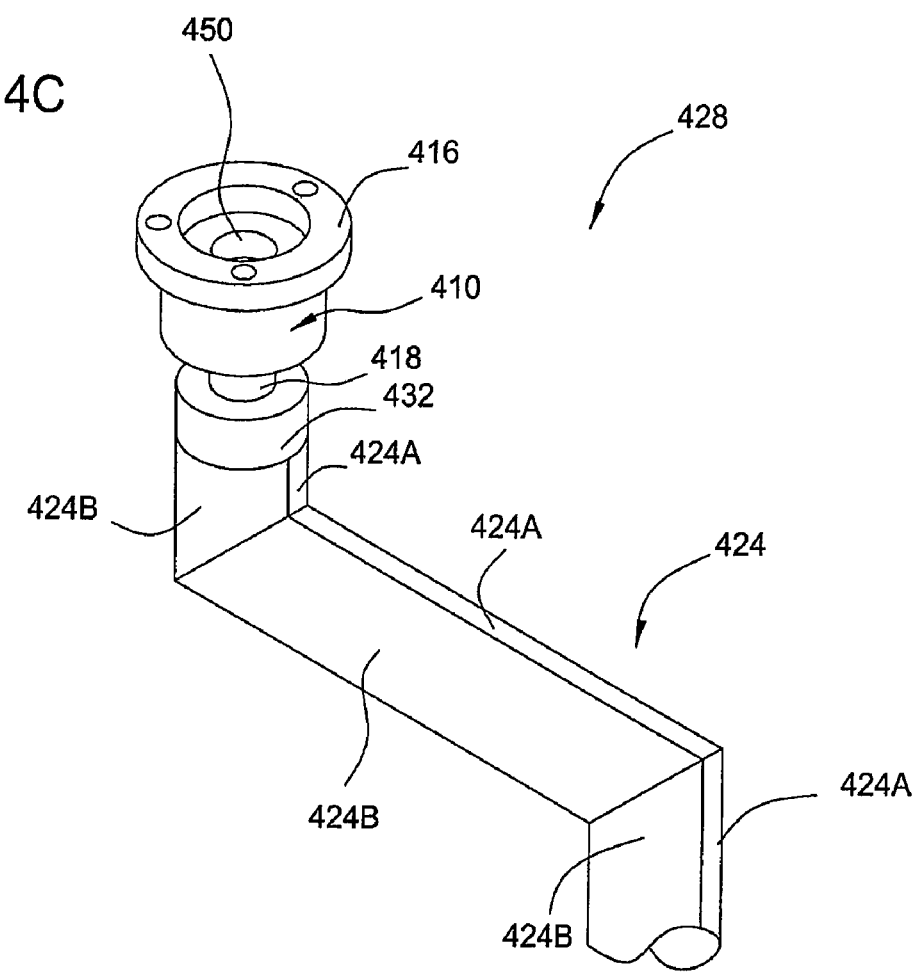
FIG. 4C depicts a perspective view of an RF terminal mounted on the RF transmission line of FIG. 4A.

FIG. 4C depicts a perspective view of the terminal 410 disposed on the RF transmission line 428. The upper portion 416 of the terminal 410 has an annual opening utilized to be attached to the bottom surface of the facility plate 301. The lower portion 418 of the terminal 410 extends through the insulator 432 and mates with the opening 496 of the RF transmission line 428.

Figure 5A:
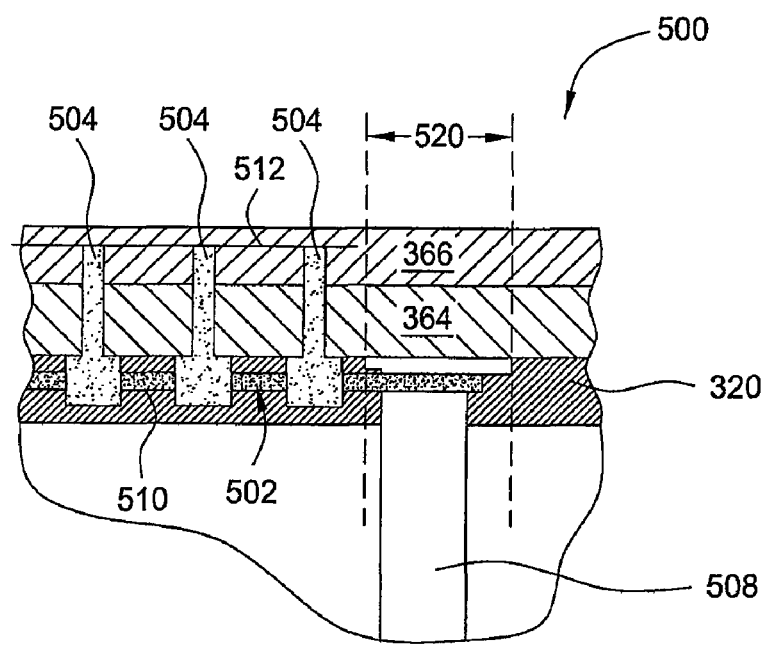
FIG. 5A depicts a sectional view of another embodiment of a substrate support assembly in accordance with the present invention.
Figure 5B:
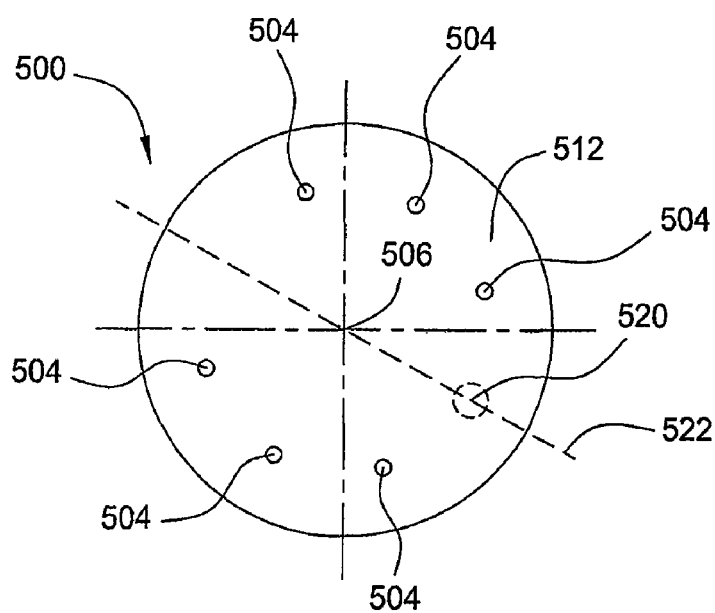
FIG. 5B depicts a top view of substrate support assembly of FIG. 5A.

FIG. 5A depicts of a sectional view of another embodiment of substrate support assembly 500 that can provide uniform electric field across a substrate surface. Similar to the configurations of FIG. 3, the substrate support assembly 500 includes the electrostatic chuck 366 attached to the base plate 364. The dielectric insulating ring 320 is coupled to a bottom surface of the base plate 364. An RF transmission line 508 is attached to the base plate 364 circumscribed by the dielectric insulating ring 320. The RF power from the RF transmission line 508 is transmitted to the substrate support assembly 500 through a metal plate 502 disposed on the dielectric insulating ring 320 connecting to the RF transmission line 508. As discussed above, routine utilities and/or some mechanical supports may be disposed around a center axis 506 (as seen in FIG. 5B) below the substrate support assembly 500, the RF transmission line 508 is therefore desired to be disposed at a location 520 offset to the center axis 506. By utilizing the metal plate 502 disposed in the dielectric insulating ring 320, the RF power from the RF transmission line 508 can be delivered to the substrate support assembly 500 through the metal plate 502 connected thereto. In order to avoid skew pattern that may occur due to the offset attachment of the RF transmission line 508, the metal plate 502 is configured to have multiple conduits 504 protruded upward from a base 510. The conduits 504 are formed substantially perpendicular to the base 510 utilized to deliver RF power to different locations of an RF electrode 512 of the substrate support assembly 500. Each conduits 504 formed in the metal plate 502 has an end coupled to the RF electrode of the electrostatic chuck 366 to deliver RF power to different locations of the substrate support assembly 500. In one embodiment, the metal plate 502 is fabricated from a metallic material selected from a group consisting of copper, aluminum, stainless steel and combinations thereof.

FIG. 5B depicts a perspective top view of the RF electrode 512 embedded in the electrostatic chuck 366 of the substrate support assembly 500. The RF transmission line 508 is offset attached at the region 520 underneath the substrate support assembly 508, as shown in dotted line. As the offset attachment of the RF transmission line 508 may result in non-uniform electric field distribution, the distribution of the conduits 504 is arranged in a symmetrical manner utilizing an axis 522 passing through the region 520 as a center axis. The distribution of the conduits 504 may efficiently alter the electric field distributed across the substrate surface. The adjustable and alterable conduit distribution of the metal plate 502 may efficiently control and redistribute electric field across the surface of the substrate support assembly. In one embodiment, the adjustable and alterable conduit distribution of the metal plate 502 resolves the potential localized and non-uniform electric field profile that may occur due to the offset attachment of the RF transmission line 508. The conduits 504 provide different contact points across the RF electrode 512 of the electrostatic chuck 366 to uniformly delivery RF power to different locations across the electrostatic chuck surface so that the influence of the electric field at location 520 above the location of the transmission line 508 is balanced and negated. Although six conduits 504 are shown in the FIG. 5B, it is noted that the number, distribution, shape and locations of the conduits 504 may be arranged in any manner suitable for providing a uniform profile and distribution of electric field generated from RF power to balance the effect of the transmission line offset. As the electric field distribution is controlled and maintained uniformly across the substrate surface, a uniform etching performance may be therefore obtained.

A mixture of process, direct injection and inert gases are provided to the chamber for plasma etching. The mixture may include at least one of HBr, $NF_3$, $O_2$, $SiF_4$, $SiCl_4$ and Ar. In one embodiment, the process gases provided to the mixing manifold include HBr and $NF_3$, while $O_2$, $SiF_4$ and $SiCl_4$ may optionally be provided. In an exemplary embodiment, between about 50 to about 500 sccm of HBr, between about 10 to about 200 sccm of $NF_3$, between about 0 to about 200 sccm of $O_2$, between about 0 to about 200 sccm of $SiF_4$, between about 0 to about 200 sccm of $SiCl_4$, and between about 0 to about 200 sccm of Ar are provided to the mixing manifold for a process suitable for etching a 300 mm substrate. The mixed gases are provided to the plenums at a flow ratio selected commensurate with the feature density, size and lateral location. $SiCl_4$ may be used as a direct injection gas provided to the plenums of the showerhead assembly bypassing the mixing manifold.

Various embodiments of the present invention provide an apparatus and method that provide high etching uniformity across a substrate surface. The configuration of multiple contact points for RF power delivery and/or the bent RF transmission line advantageously provides a manner to compensate electric field skew pattern that may occurred in the conventional apparatus. Additionally, the configuration of multiple contact points of RF power delivery and/or the bent RF transmission line improve the uniformity of the electric field profile distributed across the substrate surface and therefore improving the overall etching uniformity.

While the foregoing is directed to embodiments of the present invention, other and further embodiments of the invention may be devised without departing from the basic scope thereof, and the scope thereof is determined by the claims that follow.

What is claimed is:

1. A substrate support assembly, comprising:
a substrate support assembly comprising a center passage formed along a center axis of the substrate support assembly;
an RF transmission line comprising a substantially vertical portion and a substantially horizontal portion, the substantially horizontal portion having a first end and a second end, the second end coupled to the substantially vertical portion, the substantially vertical portion extending downwardly from the substantially horizontal portion;
a terminal coupled to the first end of the substantially horizontal portion of the RF transmission line through the center passage of the substrate support assembly; and
a dielectric insulator circumscribing the substantially horizontal portion of the RF transmission line, wherein the dielectric insulator has a first opening through which the terminal is disposed therethrough.

2. The substrate support assembly of claim 1, wherein the substantially horizontal portion of the RF transmission line further comprises:
a conductive connector comprising a first aperture at the first end and a second aperture at the opposing second end, the terminal mating with the first aperture.

3. The substrate support assembly of claim 2, wherein the substantially vertical portion of the RF transmission line further comprises:
a conductive rod mating with the second aperture.

4. The substrate support assembly of claim 1, wherein the dielectric insulator further comprises:
a second opening concentrically aligned with the first opening.

5. The substrate support assembly of claim 4 further comprising:
a high voltage power feed extending through the first and second openings of the dielectric insulator, the power feed passing through and electrically insulated from the terminal.

6. The substrate support assembly of claim 5, wherein the high voltage power feed extends through the center passage of the substrate support assembly.

7. The substrate support assembly of claim 1, wherein the RF transmission line further comprises:
an RF conductive rod; and
a conductive connector coupled to the rod, wherein the dielectric insulator circumscribes the conductive connector and the RF rod.

8. The substrate support assembly of claim 7, wherein the RF conductive rod is fabricated from a metallic material selected from at least one of copper, silver or gold.

9. The substrate support assembly of claim 1, wherein the dielectric insulator is fabricated from a plastic material selected from at least one of plastic, polymer or fluorocarbon.

10. The substrate support assembly of claim 1, wherein the dielectric insulator further comprises:
a first shell and a second shell, the shells mating to circumscribe the substantially horizontal portion of the RF transmission line.

11. The substrate support assembly of claim 1, wherein the substantially horizontal portion of the RF transmission line has a length between about 1 inch and about 5 inch.

12. A substrate support assembly, comprising:
a substrate support assembly comprising a center passage formed along a center axis of the substrate support assembly, the substrate support assembly having an electrostatic chuck, a conductive base, and a conductive facility plate, the facility plate electrically coupled to an RF electrode, the RF electrode insulated from a chucking electrode embedded in the electrostatic chuck;
an RF transmission line comprising a substantially horizontal portion having a first end aligned with the center axis and extending laterally to a substantially vertical portion that is offset from the center axis, the substantially vertical portion of the RF transmission line extending from the substantially horizontal portion in a direction away from the electrostatic chuck;

a terminal comprising a first end coupled to the facility plate and a second end coupled to the RF transmission line, the terminal disposed on the center axis;

a dielectric insulator circumscribing the horizontal portion of the RF transmission line, wherein the dielectric insulator has a first opening through which the terminal is disposed therethrough and a second opening concentrically aligned with the first opening;

a housing assembly securing the dielectric insulator to the facility plate, the housing assembly comprising a hole aligned with the second opening; and a high voltage power feed extending through the hole of the housing assembly, first and second openings of the dielectric insulator and the terminal to the chucking electrode, the high voltage power feed insulated from the RF transmission line, high voltage power feed disposed on the center axis concentric with the terminal.

13. The substrate support assembly of claim 12, wherein the RF transmission line further comprises:

a conductive connector comprising a first end mating with the terminal; and a conductive rod mating with a second end of the connector.

14. The substrate support assembly of claim 13, wherein the first end of the conductive connector includes an aperture concentrically aligned with the first and second openings of the dielectric insulator.

15. The substrate support assembly of claim 12, wherein the dielectric insulator further comprises:

a first shell and a second shell, the shells mating to circumscribe the portion of the RF transmission line coupling to the terminal.

* * * * *